United States Patent
Cho et al.

(10) Patent No.: US 8,241,974 B2
(45) Date of Patent: Aug. 14, 2012

(54) NONVOLATILE MEMORY DEVICE WITH MULTIPLE BLOCKING LAYERS AND METHOD OF FABRICATING THE SAME

(75) Inventors: Heung-Jae Cho, Icheon-si (KR);
 Moon-Sig Joo, Icheon-si (KR);
 Yong-Soo Kim, Icheon-si (KR);
 Won-Joon Choi, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 13/166,273

(22) Filed: Jun. 22, 2011

(65) Prior Publication Data

US 2011/0250746 A1 Oct. 13, 2011

Related U.S. Application Data

(62) Division of application No. 13/047,258, filed on Mar. 14, 2011, now Pat. No. 8,039,337, and a division of application No. 12/430,481, filed on Apr. 27, 2009, now Pat. No. 7,928,493.

(30) Foreign Application Priority Data

Apr. 30, 2008 (KR) .................. 10-2008-0040832

(51) Int. Cl.
 *H01L 21/8238* (2006.01)

(52) U.S. Cl. . 438/201; 438/211; 438/257; 257/E21.179; 257/E21.422

(58) Field of Classification Search ............... 438/201, 438/211, 257, 593; 257/E21.179, E21.422, 257/E21.68
See application file for complete search history.

(56) References Cited

U.S. PATENT DOCUMENTS

| 2005/0141286 | A1 | 6/2005 | Jung |
| 2008/0233762 | A1 | 9/2008 | Hong |
| 2009/0050953 | A1* | 2/2009 | Wang et al. ............ 257/324 |
| 2009/0280583 | A1 | 11/2009 | Hirasawa et al. |

FOREIGN PATENT DOCUMENTS

| KR | 1020010066386 | 7/2001 |
| KR | 1020030002298 | 1/2003 |
| KR | 1020060104717 | 10/2006 |

OTHER PUBLICATIONS

Korean Office Action for 10-2008-0040832.

* cited by examiner

*Primary Examiner* — Hoai V Pham
(74) *Attorney, Agent, or Firm* — Lowe Hauptman Ham & Berner, LLP

(57) ABSTRACT

A nonvolatile memory device with a blocking layer controlling the transfer of electric charges in a charge storage layer includes the blocking layer having a first blocking layer in contact with the charge storage layer and a second blocking layer over the first blocking layer, wherein the first blocking layer has a greater energy band gap than the second blocking layer and the second blocking layer has a greater permittivity than the first blocking layer.

15 Claims, 13 Drawing Sheets

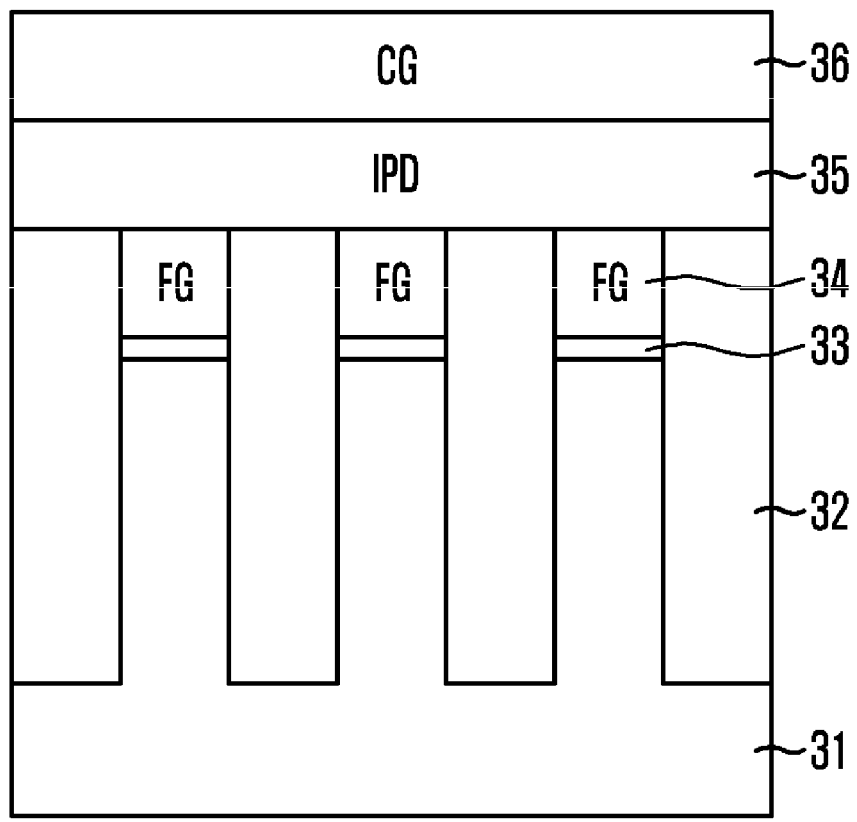

NONVOLATILE MEMORY DEVICE WITH MULTIPLE BLOCKING LAYERS AND METHOD OF FABRICATING THE SAME

CROSS-REFERENCE TO RELATED APPLICATIONS

The present application is a Divisional Application of U.S. patent application Ser. No. 13/047,258, filed on Mar. 14, 2011, which also is a Divisional Application of U.S. patent application Ser. No. 12/430,481, filed Apr. 27, 2009, which claims priority of Korean patent application number 10-2008-0040832, filed on Apr. 30, 2008, which is incorporated herein by reference in its entirety.

BACKGROUND

The disclosure relates to a method of fabricating a semiconductor device, and more particularly to a nonvolatile memory device and a method of fabricating the same.

Nonvolatile memory devices are divided into a floating gate (FG) type and a charge trap type depending on the type of the electric charge storage layer. The floating gate type can keep electric charges into the floating gate as a form of free charges, and the charge trap type can keep electric charges in traps which are provided in the charge storage layer. The floating gate type includes a dielectric layer between control gates. The dielectric layer may include a stack structure of an oxide layer, a nitride layer and an oxide layer, i.e., an ONO layer or a high k dielectric layer.

The typical charge trap type nonvolatile memory device may include a MANOS structure, as shown in FIG. 1A.

FIG. 1A illustrates a cross-sectional view of a charge trap type nonvolatile memory device with a typical metal/aluminum oxide/nitride/oxide/silicon (MANOS) structure.

Referring to FIG. 1A, the MANOS structure includes a silicon substrate 11, a tunneling layer 12, a silicon nitride ($Si_3N_4$) layer 13, an aluminum oxide layer 14 and a metal layer 15. The tunneling layer 12 may include a silicon oxide layer.

The floating gate type nonvolatile memory device with an ONO structure may have a structure as shown in FIG. 1B.

FIG. 1B illustrates a cross-sectional view of a typical floating gate type nonvolatile memory device with an ONO structure. An isolation layer 22 is formed over a substrate 21 having trenches. More particularity, the isolation layer 22 is formed to fill the trenches of the substrate 31. A tunneling layer 23 and a floating gate 24 are sequentially formed over protruding portions of the substrate 21. Then, an ONO layer 25 and a control gate 26 are formed over the floating gate 24 and the isolation layer 22 in sequence.

Referring to FIG. 1B, a substantial magnitude of capacitance may be ensured since the ONO layer 25 and the control gate 26 are surrounding the floating gate 24. Due to this structure, the coupling ratio of the device may be increased. However, in a highly integrated nonvolatile memory device having a line width of 40 nm or less, an interference C between neighboring floating gates may occur. In order to overcome such drawbacks as interferences, the structure as shown in FIG. 1C may be suggested.

FIG. 1C illustrates a cross-sectional view of a floating gate type nonvolatile memory device with a typical inter poly dielectric (IPD) structure.

Referring to FIG. 1C, an isolation layer 32 is formed over a substrate 31 having trenches. More particularity, the isolation layer 32 is formed to fill the trenches of the substrate 31. A tunneling layer 33 and a floating gate (FG) 34 are sequentially formed over protruding portions of the substrate 31. The gap between neighboring floating gates 34 is filled with the isolation layer 32. An IPD 35 and a control gate (CG) 36 are sequentially formed over a planarized surface of the floating gate 34 and the isolation layer 32.

The capacitance area of the structure as shown in FIG. 1C may be decreased, when compared to the capacitance area of the structure as shown in FIG. 1A, since the IPD 35 and the control gate 36 are formed over the surface of the floating gate 34. Thus, the equivalent oxide thickness (EOT) of the IPD 35 should be decreased in order to increase its coupling ratio. In order to increase the coupling ratio, it is suggested to use a high-k dielectric layer having a greater dielectric constant than the ONO structure as an IPD layer.

However, since the silicon nitride layer ($Si_3N_4$) 13 is used as a charge storage layer in the typical MANOS structure, the silicon nitride layer 13 may not be removed. Furthermore, the low energy band gap of the aluminum oxide layer 14 that is used as a blocking layer and many trap site formed in the aluminum oxide layer 14 deteriorate the date retention characteristics of the nonvolatile memory devices.

Moreover, in the typical floating gate structure as shown in FIG. 1C, since most of the high-k dielectric layers have a low energy band-gap and many trap site, the device's speed characteristics in programming and erasing operations and data retention characteristics are deteriorated.

FIG. 2 is a graph illustrating the loss of electric charges in a data retention mode with respect to a nonvolatile memory device having a typical MONOS structure.

Referring to FIG. 2, in the data retention mode, an energy band has a slight tilt. The tilt is caused by an internal field owing to electron charges trapped in a charge storage layer. Thus, some of the electric charges are lost in the data retention mode since the electric charges trapped in the charge storage layer are drained off to the blocking layer.

In general, when an electron having the highest trap level in the silicon nitride layer is in a thermally excited state, the excited electron (e) transfers to the conduction band $E_c$ of the silicon nitride layer.

At first, the electron (e) transferred to the conduction band is likely to jump over the band offset (BO) ① since the band offset (BO) between the conduction bands of the silicon nitride layer and the aluminum oxide layer is small.

Then, the electron (e) that has been transferred to the conduction band $E_c$ of the silicon nitride layer is drained off through the many traps T ②.

The above-mentioned loss of the electric charges may occur in floating gates. That is, the electric charges stored in the floating gate may be lost owing to the use of a high-k dielectric layer having a low energy band gap and many trap sites.

SUMMARY

In accordance with one or more embodiments, a nonvolatile memory device with a blocking layer controls the transfer of electric charges in a charge storage layer. The nonvolatile memory device includes the blocking layer having a first blocking layer in contact with the charge storage layer and a second blocking layer over the first blocking layer, wherein the first blocking layer has a greater energy band gap than the second blocking layer, and the second blocking layer has a greater permittivity than the first blocking layer.

In accordance with one or more embodiments, there is provided a method of fabricating a nonvolatile memory device. The method includes forming a tunneling layer over a first conductive layer, forming a charge storage layer over the tunneling layer, forming a blocking layer including a first blocking layer and a second blocking layer, and forming a second conductive layer over the blocking layer, wherein the first blocking layer contacting the charge storage layer has a greater energy band gap than the second blocking layer formed over the first blocking layer.

BRIEF DESCRIPTION OF THE DRAWINGS

FIG. 1C illustrates a cross-sectional view of a floating gate type nonvolatile memory device with a typical inter poly dielectric (IPD) structure.

DESCRIPTION OF EMBODIMENTS

Nonvolatile memory devices in accordance with some embodiments are capable of improving a speed characteristic of programming and erasing operations and a data retention characteristic.

In nonvolatile memory devices including a blocking layer for preventing a transfer of electric charges stored in a charge storage layer, the blocking layer according to an embodiment is a compound of materials having different energy band gaps. The blocking layer may include a high-k dielectric layer having a high dielectric constant in order to decrease its equivalent oxide thickness (EOT). The high-k dielectric layer having the high dielectric constant represents a layer formed of a material which has a dielectric constant greater than that of silicon oxide ($SiO_2$) or silicon nitride ($Si_3N_4$). Specifically, the high dielectric constant of the high-k dielectric layer is equal to or greater than 9. The blocking layer also includes a material having a greater energy band gap than that of the high-k dielectric layer in order to prevent a loss of electric charges of the charge storage layer due to the low energy band gap and many trap sites of the high-k dielectric layer.

Therefore, the blocking layer in one or more embodiments includes a multilayer structure which is a stack of materials having different energy band gaps.

Figure 3A:
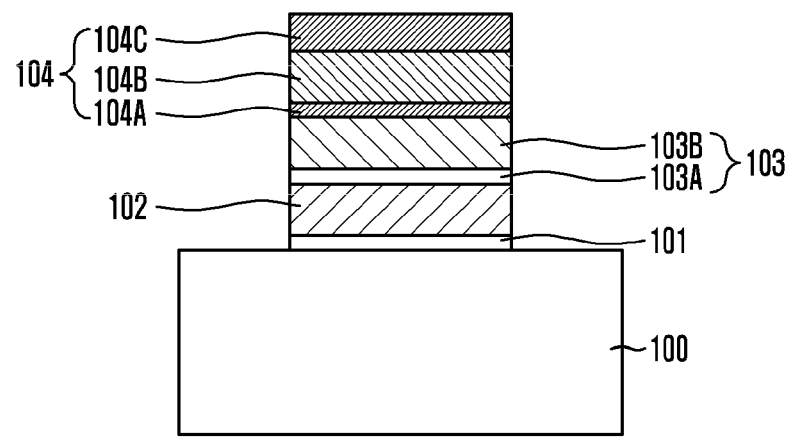
FIG. 3A illustrates a cross-sectional view of a nonvolatile memory device structure in accordance with an embodiment.

FIG. 3A illustrates a cross-sectional view of a nonvolatile memory device structure in accordance with an embodiment.

Referring to FIG. 3A, a tunneling layer 101 is formed over a first conductive layer 100. A charge storage layer 102 is formed over the tunneling layer 101, and a blocking layer 103 is formed over the charge storage layer 102. A second conductive layer 104 is formed over the blocking layer 103. Herein, when a layer is referred to as being "on/over" another layer or substrate, it can be directly on the other layer or substrate, or intervening layers may also be present. In addition, when a layer is referred to as being 'between' two layers, it can be the only layer between the two layers, or one or more intervening layers may also be present.

The first conductive layer 100 may include a silicon substrate, and the silicon substrate may be doped with impurities such as a P-type impurity or N-type impurity. More particularly, the silicon substrate may be doped with a P-type impurity such as boron (B). Furthermore, the first conductive layer 100 may include a channel region, and a source region and a drain region formed on both sides of the channel region.

The second conductive layer 104 may include a polysilicon layer or a stack structure of a polysilicon layer and a metal layer. As an example, FIG. 3A illustrates a stack structure of a first metal layer 104A, a polysilicon layer 104B and a second metal layer 104C. In the stack structure shown in FIG. 3A, the first metal layer 104A may include a metal layer having a high work function greater than a mid gap. In general, the work function of a material represents the energy difference between the Fermi level and vacuum level the material. Furthermore, the high work function greater than the mid gap means that a work function of the material is greater than a mid gap of silicon, wherein the mid gap of a material represents the difference in energy level between the valence band and the conduction band of the material. Thus, the high work function greater than the mid gap has a range of approximately 4.0 eV to approximately 5.3 eV. The metal layer with a high work function within the above range may include one selected from a group consisting of Pt, Ru, TiN, WN, TaN, Ir, Mo, Co, Ni, NiSi, NiPtSi, NiCSi, CoSi, and a combination thereof. The first metal layer 104A having the high work function contacts with the blocking layer 103, thus improving the leakage current characteristics of the blocking layer 103. Furthermore, the polysilicon layer 104B in the stack structure is used as a control gate, and the second metal layer 104C may include a low resistance metal layer, such as tungsten (W), for decreasing the resistance of the control gate. Although it is not shown, a hard mask insulation layer may be formed over the second metal layer 104.

The tunneling layer 101 may include a material having a greater energy band gap than those of the first conductive layer 100 and the charge storage layer 102. More particularly, the tunneling layer 101 may include an oxide layer such as a silicon oxide ($SiO_2$) layer or an oxynitride-containing layer such as a silicon oxynitride (SiON) layer. As described above, when the tunneling layer 101 has a large band gap, the electric charges programmed in the charge storage layer 102 cannot jump or transfer.

The charge storage layer 102 is used to trap electrons or holes injected through the tunneling layer 101. Therefore, the charge storage layer 102 may be referred to as a charge trap layer or a charge accumulating layer. The charge storage layer 102 may include a material containing nitride such as silicon nitride ($Si_3N_4$) in order to have a high density of trap sites. Furthermore, the charge storage layer 102 may include a polysilicon layer. In general, when the charge storage layer 102 in a device includes a silicon nitride layer, the device becomes a charge trap type nonvolatile memory device, and when the charge storage layer 102 in a device includes a polysilicon layer, the device becomes a floating type nonvolatile memory device. Hereinafter, the charge storage layer 102 is regarded as including a silicon nitride layer for the purpose of simplification, while the charge storage layer 102 may instead include a polysilicon layer.

While the electric charges that have transferred through the tunneling layer 101 are trapped in the charge storage layer 102, the blocking layer 103 formed between the charge storage layer 102 and the second conductive layer 104 is used as an insulation layer for preventing the electric charges from transferring to the second conductive layer 104. Thus, the blocking layer 103 may include a high-k dielectric layer having a high permittivity in order to prevent the transfer of the electric charges and decrease the EOT. However, since the high-k dielectric layer that is used as the blocking layer 103 has a low energy band gap and many trap sites, some loss of the electric charges in the charge storage layer 102 may be inevitable when the blocking layer 103 is in direct contact with the charge storage layer 102. That is, the electric charges in the charge storage layer 102 may transfer to the blocking layer 103 due to the low energy band gap of the high-k dielectric layer that is used as the blocking layer 103. Thus, the electric charges are trapped in the trap sites of the blocking layer 103, and the loss of the electric charges in the charge storage layer 102 is caused.

In order to prevent the loss of the electric charges in the charge storage layer 102, the blocking layer 103 may include a first blocking layer 103A in contact with the charge storage layer 102. Therefore, the blocking layer 103 may include the first blocking layer 103A forming an interface by contacting with the charge storage layer 102 and a second blocking layer 103B formed by using a high-k dielectric layer. In this embodiment, the second blocking layer 103B may contact with the second conductive layer 104.

The first blocking layer 103A is formed by using a dielectric layer having a greater energy band gap $E_g$ than that of the second blocking layer 103B in order to prevent the transfer of the electric charges in the charge storage layer 102. The first blocking layer 103A having a high energy band gap has a low permittivity due to the high energy band gap. Thus, the first blocking layer 103A has less trap sites than the second blocking layer 103B including the high-k dielectric layer.

When the first blocking layer 103A has a high energy band gap, the band offset value generated at the interface between the first blocking layer 103A and the charge storage layer 102 may be high. The band offset represents an energy difference between the conduction bands of two contacting materials in an energy band diagram.

The first blocking layer 103A may include a material having a band offset greater than the band offset caused by contacting the second blocking layer 103B and the charge storage layer 102. When an electric potential barrier becomes high, the electric charges in the charge storage layer 102 may not jump or transfer. Thus, jump or transfer of the electric charges in the charge storage layer 102 can be controlled, since the electric potential barrier becomes high when the value of the band offset is high. The band offset will be described in FIG. 3B.

Moreover, when the first blocking layer 103A has a low permittivity, the probability of the electric charges being trapped in the first blocking layer 103A may be decreased since the first blocking layer 103A has a small number of trap sites. That is, the first blocking layer 103A has a trap density smaller than those of the second blocking layer 103B and the charge storage layer 102.

When the second blocking layer 103B includes a high-k dielectric layer, the first blocking layer 103A may include a dielectric layer having a greater energy band gap than that of the high-k dielectric layer.

The high-k dielectric layer used as the second blocking layer 103B may include MAlO, wherein M represents a metal, or DyScO including dysprosium (Dy) and scandium (Sc). The M in MAlO may include one selected from a group consisting of Hf, Zr, La, Gd, Y, Nd, Ce and Pr. Thus, the MAlO becomes one selected from a group consisting of HfAlO, ZrAlO, LaAlO, GdAlO, YAlO, NdAlO, CeAlO and PrAlO. The high-k dielectric layers described herein have an energy band gap ranging from approximately 3 eV to approximately 6 eV. The second blocking layer 103B may include an aluminum oxide layer or a metal oxide layer, wherein the metal includes one selected from a group consisting of Hf, Zr, La, Gd, Y, Nd, Ce and Pr. In order to improve leakage current characteristics, the second blocking layer 103B may include MAlO, wherein M represents a metal, or DyScO including Dy and Sc.

The first blocking layer 103A may include an oxide layer or an oxynitride layer. The oxide layer and the oxynitride layer have a large energy band gap of approximately 9 eV. Thus, since the first blocking layer 103A having the large energy band gap has a great value of band offset at the interface between the first blocking layer 103A and the charge storage layer 102, transfer of the electric charges in the charge storage layer 102 may be controlled.

The first blocking layer 103A has a thickness smaller than that of the second blocking layer 103B and that of the charge storage layer 102. The first blocking layer 103A has a thickness ranging from approximately 20 Å to approximately 50 Å. The second blocking layer 103B has a thickness ranging from approximately 100 Å to approximately 300 Å and the charge storage layer 102 has a thickness ranging from approximately 50 Å to approximately 200 Å.

Figure 3B:
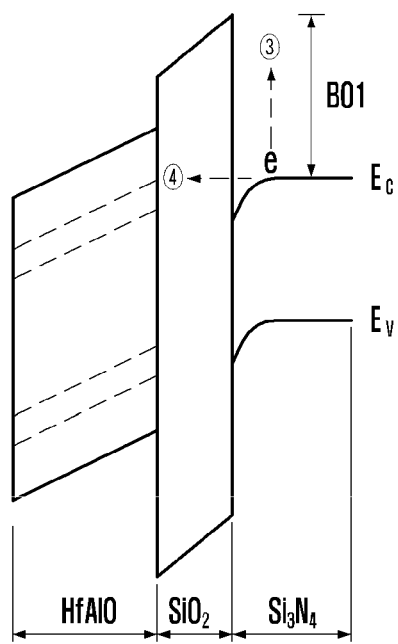
FIG. 3B shows an energy band diagram with respect to a charge storage layer and a blocking layer in accordance with the embodiment.

FIG. 3B is a graph showing an energy band diagram between a charge storage layer and a blocking layer in accordance with the embodiment.

Hereinafter, the graph of the MANOS structure in FIG. 2 and the graph of the embodiment in FIG. 3B will be compared.

Figure 1A:
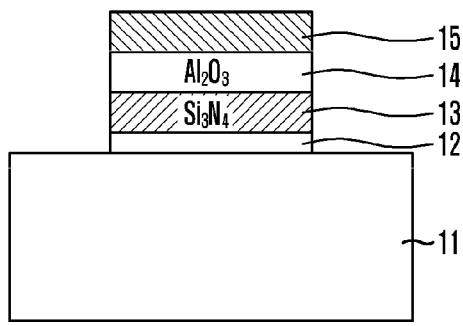
FIG. 1A illustrates a cross-sectional view of a charge trap type nonvolatile memory device with a typical metal/aluminum oxide/nitride/oxide/silicon (MANOS) structure.
Figure 1B:
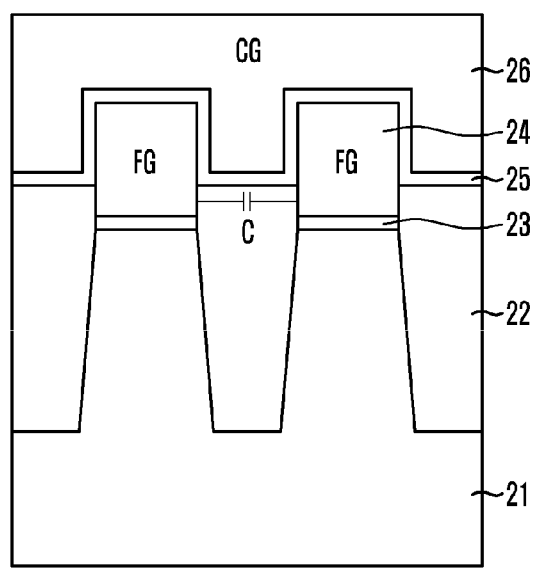
FIG. 1B illustrates a cross-sectional view of a typical floating gate type nonvolatile memory device with an oxide/nitride/oxide (ONO) structure.
Figure 2:
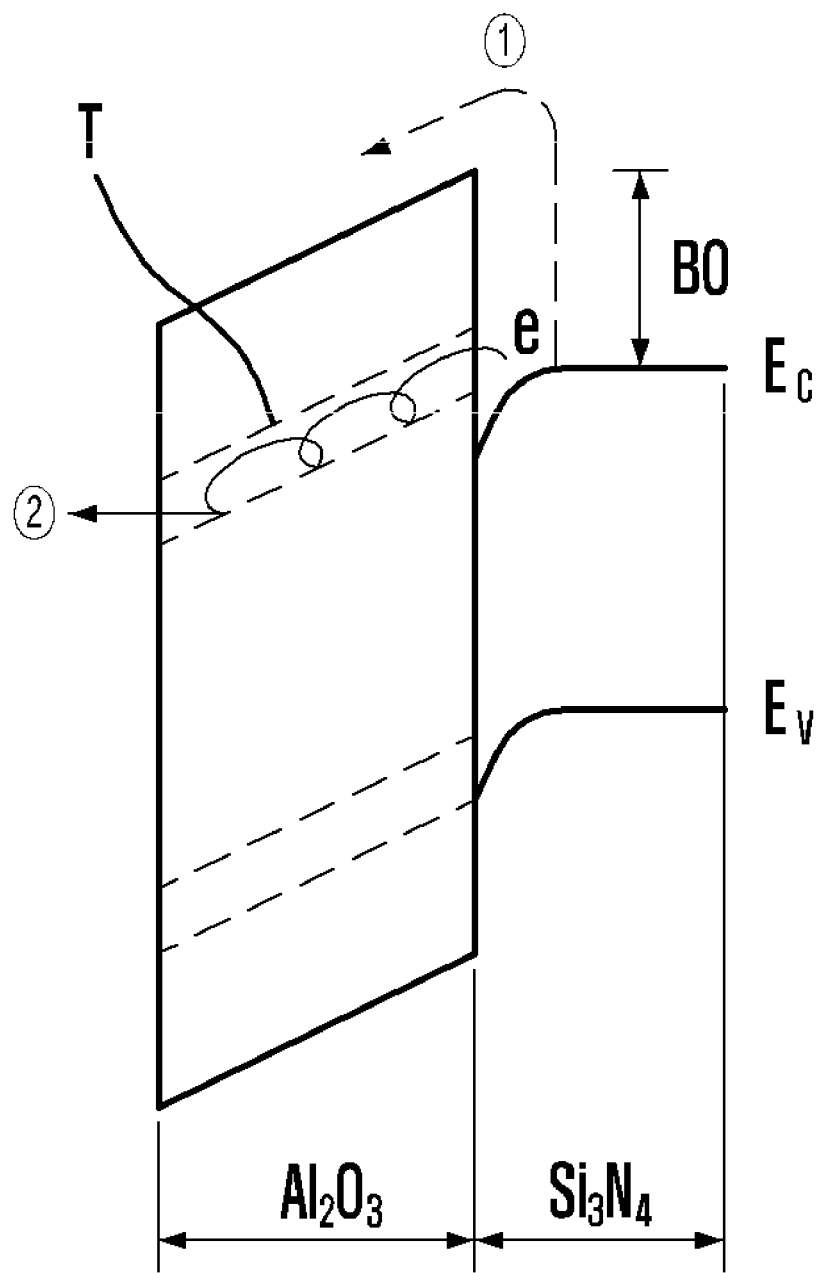
FIG. 2 is a graph illustrating the loss of electric charges in a data retention mode with respect to a nonvolatile memory device having a typical MONOS structure.

In the MANOS structure as shown in FIG. 2, the charge storage layer is a silicon nitride ($Si_3N_4$) layer and the blocking layer is an aluminum oxide ($Al_2O_3$) layer. In the embodiment as shown in FIG. 3B, the charge storage layer 102 includes the silicon nitride ($Si_3N_4$) layer, the first blocking layer 103A includes the silicon oxide ($SiO_2$) layer and the second blocking layer 103B includes the HfAlO layer. The energy band gap of HfAlO is smaller than that of aluminum oxide $Al_2O_3$ since HfAlO is formed by adding hafnium Hf into $Al_2O_3$. The energy band gap of $Al_2O_3$ ranges from approximately 6 eV to approximately 8.7 eV and the energy band gap of HfAlO ranges from approximately 4.5 eV to approximately 8 eV. Furthermore, the energy band gap of the silicon nitride layer is approximately 5.3 eV and the energy band gap of the silicon oxide layer is approximately 9 eV. The energy band gap of a material is an energy level difference between the conduction band and the valance band of the material. Moreover, since the energy band gap of the material may change depending upon formation circumstances, only approximate values have been disclosed.

Referring to FIGS. 2, 3A and 3B, when the charge storage layer 102 contacts with the first blocking layer 103A, an electric potential barrier is generated according to the energy band gap difference between the materials forming the charge storage layer 102 and the first blocking layer 103A. The band offset BO1 between the conduction bands of the silicon nitride layer and the silicon oxide layer in FIG. 3B is greater than the band offset BO between the conduction bands of the silicon nitride layer and the aluminum oxide layer in FIG. 2.

As a result, the MANOS structure of the disclosed embodiment is different from that shown in FIG. 2, even when an electron (e) stored in the silicon nitride layer as the charge storage layer obtains some energy by heating or other methods, the electron (e) cannot jump over the high band offset ③. Thus, the data retention characteristics of the nonvolatile memory device can be improved. In contrast, with regard to the MANOS structure as shown in FIG. 2, an electron 'e' in the silicon nitride layer is drained over the band offset BO ① since the band offset BO between the conduction bands of the silicon nitride layer and the aluminum oxide layer is small.

Furthermore, the probability of electrons that have transferred to the conduction band Ec of the silicon nitride layer jumping out to the silicon oxide layer ④ can be decreased since the silicon oxide layer has a low density of trap sites.

Figure 4A:
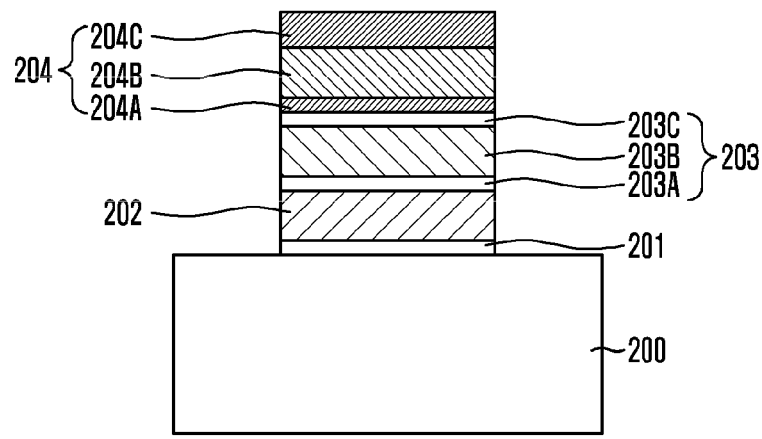
FIG. 4A illustrates a cross-sectional view of a nonvolatile memory device structure in accordance with another embodiment.

FIG. 4A illustrates a cross-sectional view of a nonvolatile memory device structure in accordance with another embodiment.

Referring to FIG. 4A, a tunneling layer 201 is formed over a first conductive layer 200. A charge storage layer 202 is formed over the tunneling layer 201 and a blocking layer 203 is formed over the charge storage layer 202. A second conductive layer 204 is formed over the blocking layer 203.

The first conductive layer 200 may include a silicon substrate and the silicon substrate may be doped with impurities such as a P-type impurity or N-type impurity. More particularly, the silicon substrate may be doped with a P-type impurity like boron (B). Furthermore, the first conductive layer 200 may include a channel region, and a source region and a drain region formed on both sides of the channel region.

The second conductive layer 204 may include a polysilicon layer, a stack structure of a polysilicon layer and a metal layer or a stack structure of a first metal layer 204A, a polysilicon layer 204B and a second metal layer 204C, as shown in FIG. 4A. In the stack structure shown in FIG. 4A, the first metal layer 204A may include a metal layer having a high work function greater than a mid gap. In general, the work function of a metal represents the energy difference between the Fermi level and the vacuum level of the metal. Furthermore, the high work function greater than the mid gap means that a work function of a material is greater than a mid gap of silicon, wherein the mid gap represents the energy level between the valence band and the conduction band. Thus, the high work function greater than the mid gap has a range of approximately 4.0 eV to approximately 5.3 eV. The metal layer with a high work function having the above range may include one selected from a group consisting of Pt, Ru, TiN, WN, TaN, Ir, Mo, Co, Ni, NiSi, NiPtSi, NiCSi, CoSi, and a combination thereof. The first metal layer 204A having a high work function contacts with the blocking layer 203, thus improving the leakage current characteristics of the blocking layer 203. Furthermore, the polysilicon layer 204B in the stack structure is used as a control gate, and the second metal layer 204C may include a tungsten layer as a low resistance metal layer for decreasing the resistance of the control gate. Although it is not shown, a hard mask insulation layer may be formed over the second metal layer 204.

The tunneling layer 201 may include a material having a greater energy band gap than those of the first conductive layer 200 and the charge storage layer 202. The tunneling layer 201 may include an oxide layer such as a silicon oxide ($SiO_2$) layer or an oxynitride-containing layer such as a silicon oxynitride (SiON) layer. As described above, when the tunneling layer 201 has a large band gap, the electric charges programmed in the charge storage layer 202 cannot jump or transfer.

The charge storage layer 202 is used to trap electrons or holes injected through the tunneling layer 201. Therefore, the charge storage layer 202 may be referred to as a charge trap layer or a charge accumulating layer. The charge storage layer 202 may include a material containing nitride such as silicon nitride ($Si_3N_4$) in order to have a high density of trap sites. Furthermore, the charge storage layer 202 may include a polysilicon layer. In general, when the charge storage layer 202 in a device includes a silicon nitride layer, the device becomes a charge trap type nonvolatile memory device, and when the charge storage layer 202 in a device includes a polysilicon layer, the device becomes a floating type nonvolatile memory device. Hereinafter, the charge storage layer 102 is regarded as including a silicon nitride layer for the purpose of simplification, while the charge storage layer 102 may instead include a polysilicon layer.

While the electric charges that have transferred through the tunneling layer 201 are trapped in the charge storage layer 202, the blocking layer 203 formed between the charge storage layer 202 and the second conductive layer 204 is used as an insulation layer preventing the electric charges from transferring to the second conductive layer 204. Thus, the blocking layer 203 may include a high-k dielectric layer having a high permittivity in order to prevent the transfer of the electric charges and decrease the EOT. The high-k dielectric layer having the high dielectric constant represents a layer formed of a material which has a dielectric constant greater than that of silicon oxide ($SiO_2$) or silicon nitride ($Si_3N_4$). Specifically, the high dielectric constant of the high-k dielectric layer is equal to or greater than 9. However, since the high-k dielectric layer that is used as the blocking layer 203 has a low energy band gap and many trap sites, the loss of the electric charges in the charge storage layer 202 may be inevitable when the blocking layer 203 is in direct contact with the charge storage layer 202. That is, the electric charges in the charge storage layer 202 may transfer to the blocking layer 203 due to the low energy band gap of the high-k dielectric layer that is used as the blocking layer 203. Thus, the electric charges are trapped in the trap sites in the blocking layer 203, and the loss of the electric charges in the charge storage layer 202 may be caused.

In order to prevent the loss of the electric charges in the charge storage layer 202, the blocking layer 203 may include a first blocking layer 203A in contact with the charge storage layer 202. Therefore, the blocking layer 203 may include the first blocking layer 203A that forms an interface by contacting with the charge storage layer 202, and a second blocking layer 203B that may be formed with a high-k dielectric layer. Furthermore, the blocking layer 203 may further include a third blocking layer 203C in order to increase its blocking characteristic at the portion in contact with the second conductive layer 204.

The first blocking layer 203A is formed by using a dielectric layer having a greater energy band gap $E_g$ than that of the second blocking layer 203B in order to prevent the transfer of the electric charges in the charge storage layer 202. The first blocking layer 203A having a high energy band gap has a low permittivity due to the high energy band gap. Thus, the first blocking layer 203A has less trap sites than the second blocking layer 203B including the high-k dielectric layer.

When the first blocking layer 203A has a high energy band gap, the band offset value that is generated at the interface between the first blocking layer 203A and the charge storage layer 202 may be high. The band offset represents the energy difference between the conduction bands of two contacting materials in an energy band diagram.

The first blocking layer 203A may include a material having a band offset greater than the band offset generated by contacting the second blocking layer 203B and the charge storage layer 202. In this embodiment, the transfer of the electric charges can be controlled, since the electric potential barrier that blocks the electric charges in the charge storage layer 202 from transferring is increased when the value of the band offset is high. The band offset will be described later in further detail with reference to FIG. 4B.

Moreover, when the first blocking layer 203A has a low permittivity, the probability of the electric charges being trapped in the first blocking layer 203A may be decreased since the first blocking layer 203A has a small number of the trap sites. That is, the first blocking layer 203A has a trap density smaller than those of the second blocking layer 203B and the charge storage layer 202.

When the second blocking layer 203B includes a high-k dielectric layer, the first blocking layer 203A may include a dielectric layer having a greater energy band gap than that of the high-k dielectric layer.

The high-k dielectric layer used as the second blocking layer 203B may include MAlO, wherein M represents a metal, or DyScO including dysprosium (Dy) and scandium (Sc). The M in MAlO may include one selected from a group consisting of Hf, Zr, La, Gd, Y, Nd, Ce and Pr. Thus, the MAlO may be, but not limited to, one selected from a group consisting of HfAlO, ZrAlO, LaAlO, GdAlO, YAlO, NdAlO, CeAlO and PrAlO. The high-k dielectric layers described herein have an energy band gap ranging from approximately 3 eV to approximately 6 eV. The second blocking layer 203B may include an aluminum oxide layer or a metal oxide layer, wherein the metal includes one selected from a group consisting of Hf, Zr, La, Gd, Y, Nd, Ce and Pr. In order to improve leakage current, the second blocking layer 203B may include MAlO, wherein M represents a metal, or DyScO including Dy and Sc.

The first blocking layer 203A may include an oxide layer or an oxynitride layer. The oxide layer and the oxynitride layer have a large energy band gap, for instance, approximately 9 eV. Thus, since the first blocking layer 203A having such a large energy band gap has a high band offset at the interface between the first blocking layer 203A and the charge storage layer 202, the transfer of the electric charges in the charge storage layer 202 can be controlled.

The first blocking layer 203A may have a thickness smaller than that of the second blocking layer 203B and that of the charge storage layer 202. The first blocking layer 203A has a thickness ranging from approximately 20 Å to approximately 50 Å. The second blocking layer 203B has a thickness ranging from approximately 100 Å to approximately 300 Å and the charge storage layer 202 has a thickness ranging from approximately 50 Å to approximately 200 Å.

The third blocking layer 203C may include a dielectric layer having a large energy band gap and a lower permittivity than that of the second blocking layer 203B. The loss of electric charges can be prevented when the third blocking layer 203C has a large energy band gap. Thus, although some electric charges in the charge storage layer 202 may transfer to the first blocking layer 203A and the second blocking layer 203B, the electric charges in the second blocking layer 203B can be prevented from transferring to the third blocking layer 203C as the third blocking layer 203C has a greater energy band gap than that of the second blocking layer 203B.

The third blocking layer 203C may have an energy band gap as high as that of the first blocking layer 203A or greater than that of the first blocking layer 203A. The third blocking layer 203C may include a metal oxide layer such as an aluminum oxide $Al_2O_3$ layer. The energy band gap of $Al_2O_3$ ranges from approximately 6 eV to approximately 8.7 eV.

As described above, the another embodiment has the blocking layer having the stack structure of dielectric layers having different energy band gaps. The blocking effect of the structure in accordance with the another embodiment can be further increased when compared to the first embodiment, since the energy band gaps of the first blocking layer 203A in contact with the charge storage layer 202, and the third blocking layer 203C in contact with the second conductive layer 203, are greater than the energy band gap of the second blocking layer 203B.

Figure 4B:
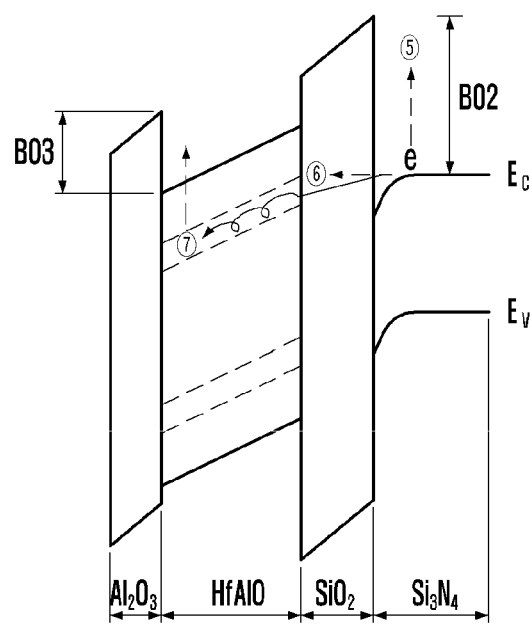
FIG. 4B shows an energy band diagram with respect to a charge storage layer and a blocking layer in accordance with the another embodiment.

FIG. 4B is a graph showing an energy band diagram with respect to the charge storage layer and the blocking layer in accordance with the another embodiment.

The graph of the MANOS structure shown in FIG. 2 will be compared with the graph of the another embodiment in FIG. 4B, as below.

In the MANOS structure as shown in FIG. 2, the charge storage layer is the silicon nitride ($Si_3N_4$) layer and the blocking layer is the aluminum oxide ($Al_2O_3$) layer. In the another embodiment as shown in FIG. 4B, the charge storage layer 202 includes the silicon nitride ($Si_3N_4$) layer, and the first blocking layer 203A includes the silicon oxide ($SiO_2$) layer. Further, the second blocking layer 203B includes a HfAlO layer, and the third blocking layer 203C includes an aluminum oxide ($Al_2O_3$) layer. In general, the energy band gap of HfAlO is smaller than that of aluminum oxide ($Al_2O_3$) since HfAlO is formed by adding hafnium (Hf) into $Al_2O_3$. The energy band gap of $Al_2O_3$ ranges from approximately 6 eV to approximately 8.7 eV, and the energy band gap of HfAlO ranges from approximately 4.5 eV to approximately 8 eV. Furthermore, the energy band gap of the silicon nitride layer is approximately 5.3 eV, and the energy band gap of the silicon oxide layer is approximately 9 eV. The energy band gap of a material is the energy level difference between the conduction band and the valance band of the material.

Referring to FIGS. 2 and 4B, when the charge storage layer 202 contacts with the first blocking layer 203A, an electric potential barrier is generated according to the energy band gap difference between the materials forming the charge storage layer 202 and the first blocking layer 203A.

The band offset BO2 between the conduction bands of the silicon nitride layer and the silicon oxide layer in FIG. 4B is greater than the band offset BO between the conduction bands of the silicon nitride layer and the aluminum oxide layer in FIG. 2.

Even when an electron (e) stored in the silicon nitride layer as the charge storage layer obtains some energy by heating or other methods, the electron (e) is not capable of jumping over the high band offset BO2 (5). Thus, data retention characteristics of the nonvolatile memory device can be improved.

In contrast, with regard to the MANOS structure as shown in FIG. 2, an electron (e) in the silicon nitride layer may jump over the band offset BO (1) since the band offset BO between the conduction bands of the silicon nitride layer and the aluminum oxide layer is small.

Furthermore, the probability of electrons that have transferred to the conduction band Ec of the silicon nitride layer being drained out to the silicon oxide layer 6 can be decreased since the silicon oxide layer has a low density of trap sites.

Moreover, in accordance with the another embodiment, even when the electric charges are trapped in the HfAlO layer as the second blocking layer 203B, the trapped electric charges cannot jump over the band offset BO3 from a trap level since there is the band offset BO3 between the HfAlO layer and the aluminum oxide layer. Thus, the loss of the electric charges can be minimized as the blocking layer includes the third blocking layer.

FIGS. 5A to 5E are cross-sectional views illustrating the nonvolatile memory device in accordance with the first embodiment.

Figure 5A:
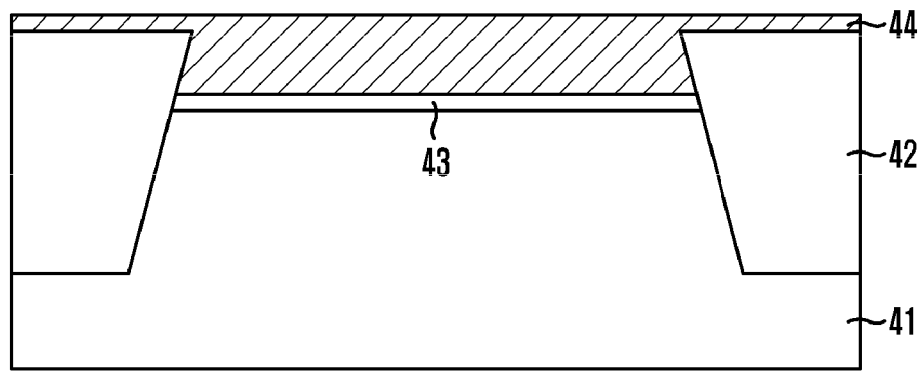
FIGS. 5A to 5E are cross-sectional views of the nonvolatile memory device in accordance with the embodiment.

Referring to FIG. 5A, a tunneling layer 43 having a predetermined thickness is formed over a substrate 41 after performing an ion implantation process on the substrate 41 and forming an isolation layer 42 over the substrate 41. The isolation layer 42 may be formed by a shallow trench isolation (STI) process, and the ion implantation process includes an ion implantation process for controlling a threshold voltage. The tunneling layer 43 may include an oxide layer or an oxynitride-containing layer. The tunneling layer may include a pure silicon oxide ($SiO_2$) layer or silicon oxynitride (SiON) layer.

A charge storage layer 44 is formed over the tunneling layer 43. The charge storage layer 44 may include a silicon nitride layer such as a $Si_3N_4$ layer or a polysilicon layer. The charge storage layer 44 has a thickness ranging from approximately 50 Å to approximately 200 Å.

A blocking layer is formed over the charge storage layer 44 after forming the charge storage layer 44 in order to cut off a current between the charge storage layer 44 and a conductive layer to be subsequently formed. The blocking layer may include a first blocking layer and a second blocking layer in accordance with the first embodiment.

Figure 5B:
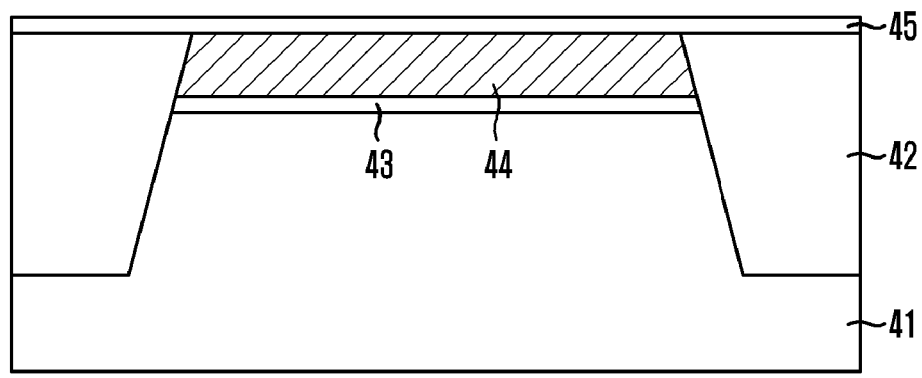

Referring to FIG. 5B, a first blocking layer 45 is formed over the charge storage layer 44. The first blocking layer 45 has a thickness ranging from approximately 20 Å to approximately 50 Å, wherein the thickness is smaller than that of the charge storage layer 44. The first blocking layer 45 may include an oxide layer or an oxynitride layer.

When the first blocking layer 45 includes an oxide layer, the first blocking layer 45 may be formed by performing a radical oxidation method that is to oxidize the surface of the charge storage layer 44. Therefore, a portion of the charge storage layer 44 is oxidized, and the oxidized portion of the charge storage layer 44 becomes the first blocking layer 45. Thus, the first blocking layer 45 is an oxide layer, and has a thickness ranging from approximately 20 Å to approximately 50 Å.

Another method for forming the first blocking layer 45 is a chemical vapor deposition (CVD) method, which can be employed to form the first blocking layer 45 having a predetermined thickness uniformly over the charge storage layer 44. When the CVD method is used for forming the first blocking layer 45, a portion of the charge storage layer 44 may not be oxidized, and an oxide layer is directly formed over the charge storage layer 44. The oxide layer formed by using the CVD method has a thickness ranging from approximately 20 Å to approximately 50 Å.

The first blocking layer 45, forming an interface with the charge storage layer 44, may be made of a material having a permittivity smaller than that of a high-k dielectric layer that is used as a second blocking layer 46. The first blocking layer 45 may include an oxide layer. The oxide layer used as the first blocking layer 45 has less trap sites than the high-k dielectric layer and, thus, the oxide layer has a large value of band offset. Thus, the oxide layer that is used as the first blocking layer 45 separates the second blocking layer 46 from the charge storage layer 44.

The radical oxidation method for forming the first blocking layer 45 includes a thermal radical oxidation process or a plasma radical oxidation process. The thermal radical oxidation process is performed at a temperature ranging from approximately 600° C. to approximately 1,200° C. and a pressure ranging from approximately 1 mTorr to approximately 100 Torr. The radical oxidation method may be implemented by performing an oxidizing method using active oxygen, for instance, by injecting a hydrogen gas ($H_2$) and oxygen gas ($O_2$) or injecting a deuterium gas $D_2$ and oxygen gas $O_2$ at the same time in order to generate the active oxygen. The plasma radical oxidation process is performed by using a gas one selected from a group consisting of a mixed gas of argon (Ar), $H_2$ and $O_2$, a mixed gas of Ar and $O_2$, a mixed gas of helium (He), $H_2$ and $O_2$, a mixed gas of He and $O_2$, a mixed gas of $H_2$ and $O_2$, an $O_2$ gas and a combination thereof, wherein the gas is used as a plasma-producing gas. Furthermore, the plasma radical oxidation process is performed with a micro wave (MW) or a radio frequency (RF) used as a plasma source. The plasma radical oxidation process is performed at a plasma power ranging from approximately 100 W to approximately 3,000 W. Furthermore, the plasma radical oxidation process is performed for a process time ranging from approximately 5 sec to approximately 600 sec, at a substrate temperature ranging from approximately 0° C. to approximately 600° C. and a flow rate of the plasma producing gas ranging from 5 sccm to approximately 2,000 sccm.

Alternatively, since the first blocking layer 45 may include the oxynitride layer instead of the oxide layer, a nitridation process may be applied in order to form the oxynitride layer. For example, an oxide layer is formed by the radical oxidation process or the CVD method, and then the nitridation process is additionally performed by using a thermal nitridation method or a plasma nitridation process. The thermal nitration process is performed at a temperature ranging from approximately 700° C. to approximately 1,000° C. and a gas atmosphere, wherein the gas may include $N_2O$, No or $NH_3$. The plasma nitridation process includes a direct plasma method for directly forming nitrogen (N) plasma and a remote plasma method for nitrifying the top surface of the target layer by supplying N radicals only after forming nitrogen plasma in a separate place. The plasma nitridation process is performed by using a gas one selected from a group consisting of a mixed gas of Ar and nitrogen gas ($N_2$), a mixed gas of He and $N_2$, a mixed gas of xenon gas (Xe) and $N_2$, $N_2$, a nitrogen monoxide gas (NO), a nitrous oxide gas ($N_2O$) and a combination thereof. Furthermore, the plasma nitridation process is performed with a MW or a RF used as a plasma source. The plasma nitridation process is performed at a plasma power ranging from approximately 100 W to approximately 3,000 W. The plasma nitridation process is performed for a process time ranging from approximately 5 sec to approximately 600 sec, at a substrate temperature ranging from approximately 0° C. to approximately 600° C. and at a flow rate of the plasma producing gas ranging from 5 sccm to approximately 2,000 sccm.

The above mentioned oxynitride layer also has an energy band gap greater than that of a high-k dielectric layer that is used as the second blocking layer 46.

Figure 5C:
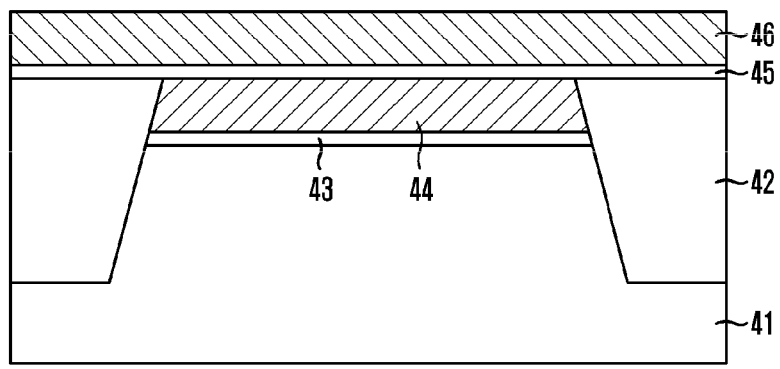

Referring to FIG. 5C, the second blocking layer 46 is formed over the first blocking layer 45 by using the high-k dielectric layer. The second blocking layer 46 has a thickness ranging from approximately 100 Å to approximately 300 Å.

The second blocking layer 46 is formed by using an aluminum-based metal oxide layer or DyScO including Dy and Sc, wherein the metal is one selected from a group consisting of Hf, Zr, La, Gd, Y, Nd, Ce and Pr. For example, the aluminum-based oxide metal layer may include one selected from a group consisting of HfAlO, ZrAlO, LaAlO, GdAlO, YAlO, NdAlO, CeAlO and PrAlO. The second blocking layer 46 is formed by using an atomic layer deposition (ALD) method or a CVD method.

The blocking layer is formed by the above mentioned processes. The blocking layer includes the first blocking layer 45 and the second blocking layer 46. The first blocking layer 45 is a layer forming the interface with the charge storage layer 44, and the second blocking layer 46 is a layer forming the interface with a subsequent conductive layer. The second blocking layer 46 and the charge storage layer 44 may be separated from each other by the first blocking layer 45, and a blocking effect may be obtained by the second blocking layer 46.

A post-treatment may be performed on the second blocking layer 46. More particularly, a post deposition annealing (PDA) process as the post-treatment may be performed on the second blocking layer 46 in order to improve the quality of the high-k dielectric layer that is used as the second blocking layer 46. The PDA process includes a furnace process or a rapid thermal process (RTP) and is performed at a temperature ranging from approximately 700° C. to approximately 1,000° C. and at a gas atmosphere, wherein the gas may include $N_2$ or $O_2$. The blocking effect of the second blocking layer 46 may be further increased by the PDA.

Figure 5D:
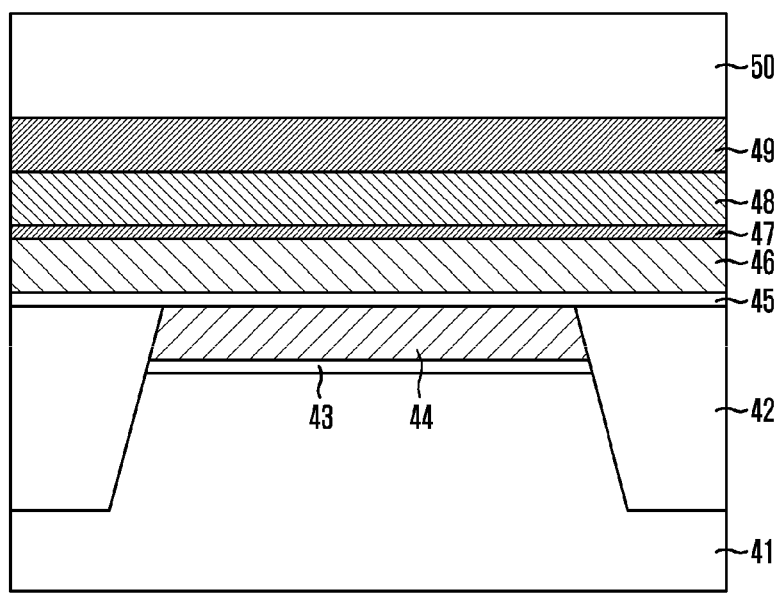

Referring to FIG. 5D, a first metal layer 47, a polysilicon layer 48 and a second metal layer 49 are sequentially formed over the second blocking layer 46. The first metal layer 47 is formed by using a material to control leakage current of the second blocking layer 46 and the material is a metal having a high work function. The first metal layer 47 with a high work function greater than a mid gap may include one selected from a group consisting of Pt, Ru, TiN, WN, TaN, Ir, Mo, Co, Ni, NiSi, NiPtSi, NiCSi, CoSi, and a combination thereof. The first metal layer 47 has a thickness ranging from approximately 50 Å to approximately 200 Å.

The polysilicon layer 48 is used as a control gate, and the second metal layer 49 may include a low resistance metal layer, such as tungsten (W), for decreasing resistance of the control gate. Although it is not shown, a barrier metal layer may be formed between the polysilicon layer 48 and the second metal layer 47 in order to prevent interactive diffusion between the polysilicon layer 48 and the second metal layer 47.

A hard mask insulation layer 50 is formed over the second metal layer 49. The hard mask insulation layer 50 is used as an etch barrier during a subsequent etching process. The hard mask insulation layer 50 may include a nitride layer.

Figure 5E:
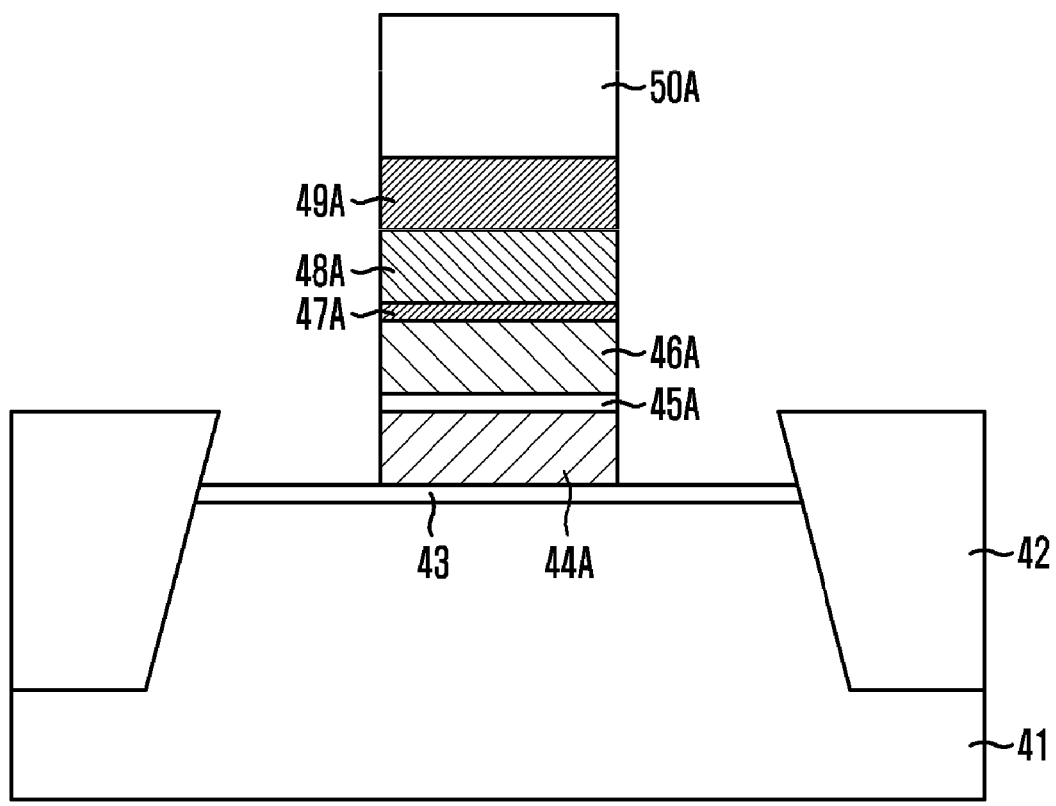

Referring to FIG. 5E, the hard mask insulation layer 50, the second metal layer 49, the polysilicon layer 48, the first metal layer 47, the second blocking layer 46, the first blocking layer 45 and the charge storage layer 44 are sequentially etched. Thus, a hard mask insulation pattern 50A, a second metal pattern 49A, a polysilicon pattern 48A, a first metal pattern 47A, a second blocking pattern 46A, a first blocking pattern 45A and a charge storage pattern 44A are formed.

In the described structure, when the charge storage pattern 44A in a device includes a silicon nitride layer, the device becomes a charge trap type nonvolatile memory device, and when the charge storage pattern 44A in a device includes a polysilicon layer, the device becomes a floating type nonvolatile memory device.

FIGS. 6A to 6F are cross-sectional views illustrating the nonvolatile memory device in accordance with the another embodiment.

Figure 6A:
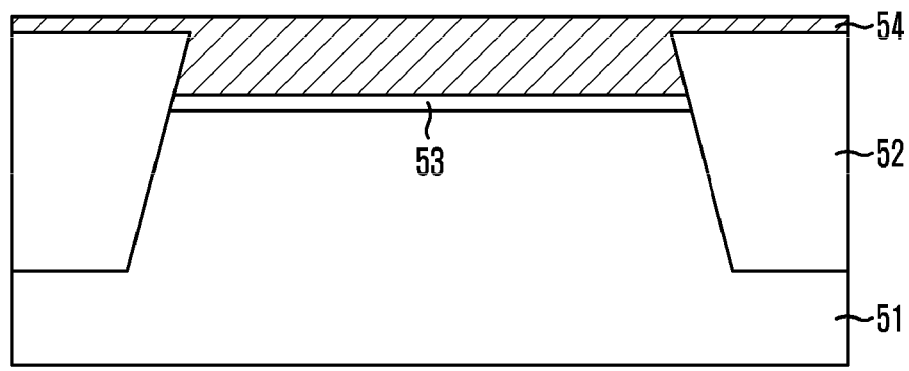
FIGS. 6A to 6F are cross-sectional views of the nonvolatile memory device in accordance with the another embodiment.

Referring to FIG. 6A, a tunneling layer 53 having a predetermined thickness is formed over a substrate 51 after performing an ion implantation process on the substrate 51 and forming an isolation layer 52 over the substrate 51. The isolation layer 52 is formed by a shallow trench isolation (STI) process, and the ion implantation process includes an ion implantation process for controlling a threshold voltage. The tunneling layer 53 may include an oxide layer or an oxynitride containing layer. The tunneling layer may include a pure silicon oxide ($SiO_2$) layer or silicon oxynitride (SiON) layer.

A charge storage layer 54 is formed over the tunneling layer 53. The charge storage layer 54 may include a silicon nitride layer such as a $Si_3N_4$ layer. The charge storage layer 54 has a thickness ranging from approximately 50 Å to approximately 200 Å.

Figure 6B:
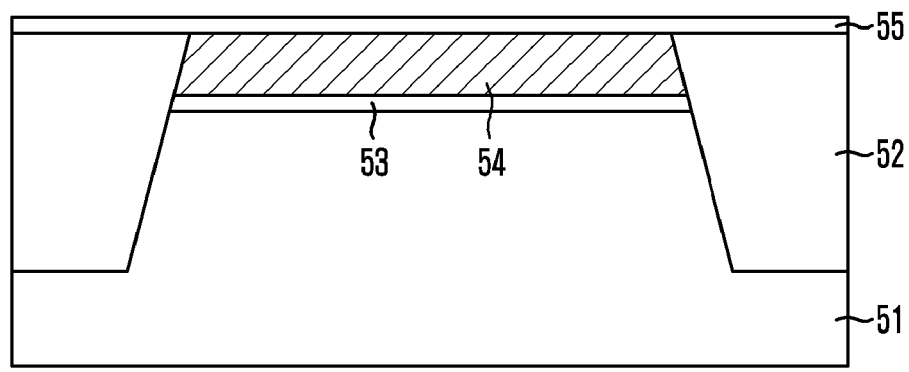

A blocking layer is formed over the charge storage layer 54 after forming the charge storage layer 54 in order to cut off a current between the charge storage layer 54 and a conductive layer subsequently formed. Referring to FIG. 6B, a first blocking layer 55 is formed over the charge storage layer 54. The first blocking layer 55 has a thickness ranging from approximately 20 Å to approximately 50 Å, wherein the thickness is smaller than that of the charge storage layer 54. The first blocking layer 55 may include an oxide layer or an oxynitride layer.

When the first blocking layer 55 includes the oxide layer, the first blocking layer 55 is formed by performing a radical oxidation method oxidizing a surface of the charge storage layer 54. Therefore, a portion of the charge storage layer 54 is oxidized and the oxidized portion of the charge storage layer 54 becomes the first blocking layer 55. Thus, the first blocking layer 55 is the oxide layer and has a thickness ranging from approximately 20 Å to approximately 50 Å.

Another method for forming the first blocking layer 55 is a chemical vapor deposition (CVD) method for forming the first blocking layer 55 having a predetermined thickness uniformly over the charge storage layer 54. When the CVD method is used for forming the first blocking layer 55, a portion of the charge storage layer 54 may not be oxidized and an oxide layer is directly formed over the charge storage layer 54. The oxide layer formed by using the CVD method has a thickness ranging of approximately 20 Å to approximately 50 Å.

The first blocking layer 55, forming an interface between the charge storage layer 54, may be made of a material having a permittivity smaller than that of the high-k dielectric layer that is used as a second blocking layer 56. The first blocking layer 55 may include an oxide layer. The oxide layer that is used as the first blocking layer 55 has less trap sites than the high-k dielectric layer and, thus, the oxide layer has a large value of band offset. Thus, the oxide layer that is used as the first blocking layer 55 separates the second blocking layer 56 from the charge storage layer 54.

The radical oxidation method for forming the first blocking layer 55 includes a thermal radical oxidation process or a plasma radical oxidation process. The thermal radical oxidation process is performed at a temperature ranging from approximately 600° C. to approximately 1,200° C. and a pressure ranging from approximately 1 mTorr to approximately 100 Torr. The radical oxidation method can be implemented by performing an oxidizing method using active oxygen, for instance, by injecting a hydrogen gas $H_2$ and oxygen gas $O_2$ or injecting a deuterium gas $D_2$ and oxygen gas $O_2$ at the same time in order to generate the active oxygen. The plasma radical oxidation process is performed by using a gas one selected from a group consisting of a mixed gas of argon (Ar), $H_2$ and $O_2$, a mixed gas of Ar and $O_2$, a mixed gas of helium (He), $H_2$ and $O_2$, a mixed gas of He and $O_2$, a mixed gas of $H_2$ and $O_2$, an $O_2$ gas and a combination thereof, wherein the gas is used as a plasma producing gas. Furthermore, the plasma radical oxidation process is performed with a micro wave (MW) or a radio frequency (RF) used as a plasma source. The plasma radical oxidation process is performed at a plasma power ranging from approximately 100 W to approximately 3,000 W. Furthermore, the plasma radical oxidation process is performed for a process time ranging from approximately 5 sec to approximately 600 sec, at a substrate temperature ranging from approximately 0° C. to approximately 600° C. and at a flow rate of the plasma producing gas ranging from 5 sccm to approximately 2,000 sccm.

Alternatively, since the first blocking layer 55 may include an oxynitride layer instead of the oxide layer, a nitridation process may be applied in order to form the oxynitride layer. For example, the oxide layer is formed by the radical oxidation process or the CVD method, and then the nitridation process is additionally performed by using a thermal nitridation method or a plasma nitridation process. The thermal nitridation process is performed at a temperature ranging from approximately 700° C. to approximately 1,000° C. and a gas atmosphere, wherein the gas may include $N_2O$, No or $NH_3$. The plasma nitridation process include a direct plasma method for directly forming nitrogen (N) plasma and a remote plasma method for nitrifying the top surface of the target layer by supplying N radicals only, after forming the nitrogen plasma in a separate place. The plasma nitridation process is performed by using a gas one selected from a group consisting of a mixed gas of Ar and nitrogen gas ($N_2$), a mixed gas of He and $N_2$, a mixed gas of xenon gas (Xe) and $N_2$, $N_2$, a nitrogen monoxide gas (NO), a nitrous oxide gas ($N_2O$) and a combination thereof. Furthermore, the plasma nitridation process is performed with a MW or a RF used as a plasma source. The plasma nitridation process is performed at a plasma power ranging from approximately 100 W to approximately 3,000 W. The plasma nitridation process is performed for a process time ranging from approximately 5 sec to approximately 600 sec, at a substrate temperature ranging from approximately 0° C. to approximately 600° C. and at a flow rate of the plasma producing gas ranging from 5 sccm to approximately 2,000 sccm.

The above mentioned oxynitride layer also has an energy band gap greater than that of the high-k dielectric layer used as the second blocking layer 56.

Figure 6C:
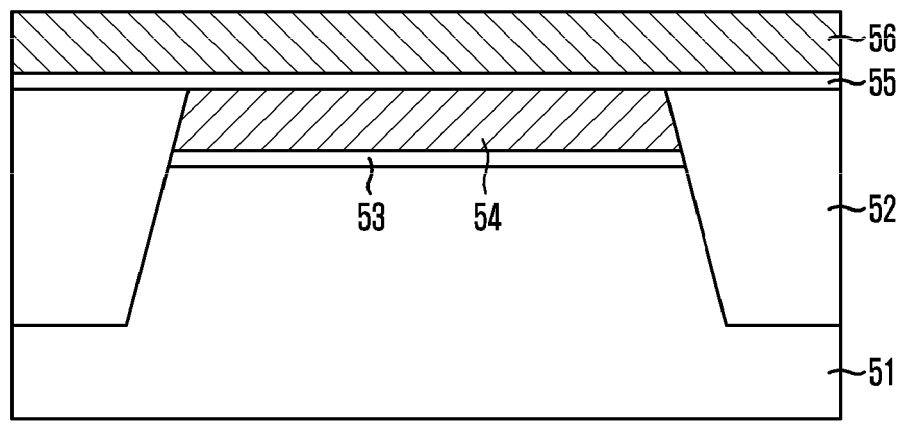

Referring to FIG. 6C, the second blocking layer 56 is formed over the first blocking layer 55 by using the high-k dielectric layer. The second blocking layer 56 has a thickness ranging from approximately 100 Å to approximately 300 Å. The second blocking layer 56 is formed by using an aluminum-based metal oxide layer or DyScO including Dy and Sc, wherein the metal is one selected from a group consisting of Hf, Zr, La, Gd, Y, Nd, Ce and Pr. For example, the aluminum-based oxide metal layer may include one selected from a group consisting of HfAlO, ZrAlO, LaAlO, GdAlO, YAlO, NdAlO, CeAlO and PrAlO. The second blocking layer 56 is formed by using an ALD method or a CVD method.

The first blocking layer 55 is a layer forming an interface with the charge storage layer 54 and the second blocking layer 56 is a layer forming an interface with a subsequent conductive layer. The second blocking layer 56 and the charge storage layer 54 can be separated by the first blocking layer 55 and a blocking effect can be obtained by the second blocking layer 56.

A post-treatment may be performed on the second blocking layer 56. More particularly, a post deposition annealing (PDA) process as the post-treatment may be performed on the second blocking layer 56 in order to improve the quality of the high-k dielectric layer used as the second blocking layer 56. The PDA process includes a furnace process or a rapid thermal process (RTP) and is performed at a temperature ranging from approximately 700° C. to approximately 1,000° C. and at a gas atmosphere, wherein the gas may include $N_2$ or $O_2$. The blocking effect of the second blocking layer 56 can be further increased by the PDA.

Figure 6D:
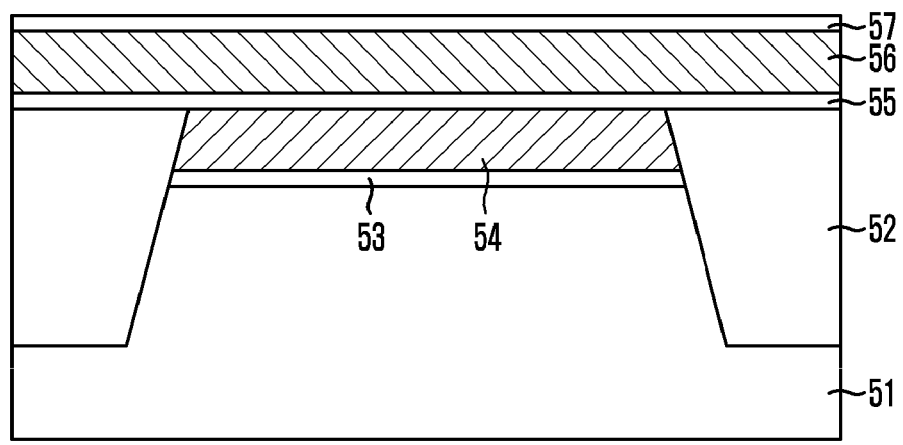

Referring to FIG. 6D, a third blocking layer 57 is formed over the second blocking layer 56. The third blocking layer 57 may include a dielectric layer, wherein the dielectric layer has a large energy band gap and a lower permittivity than that of the second blocking layer 56. Thus, the loss of the electric charges can be further prevented since the third blocking layer 57 has the large energy band gap. Thus, although some electric charges in the charge storage layer 54 transfer to the first blocking layer 55 and the second blocking layer 56, the electric charges in the second blocking layer 56 cannot transfer to the third blocking layer 57 as the third blocking layer 57 has a greater energy band gap than that of the second blocking layer 56.

The third blocking layer 57 may have an energy band gap as high as that of the first blocking layer 55 or greater than that of the first blocking layer 55. The third blocking layer 57 may include a metal oxide layer such as an aluminum oxide $Al_2O_3$ layer. The energy band gap of $Al_2O_3$ ranges from approximately 6 eV to approximately 8.7 eV.

Figure 6E:
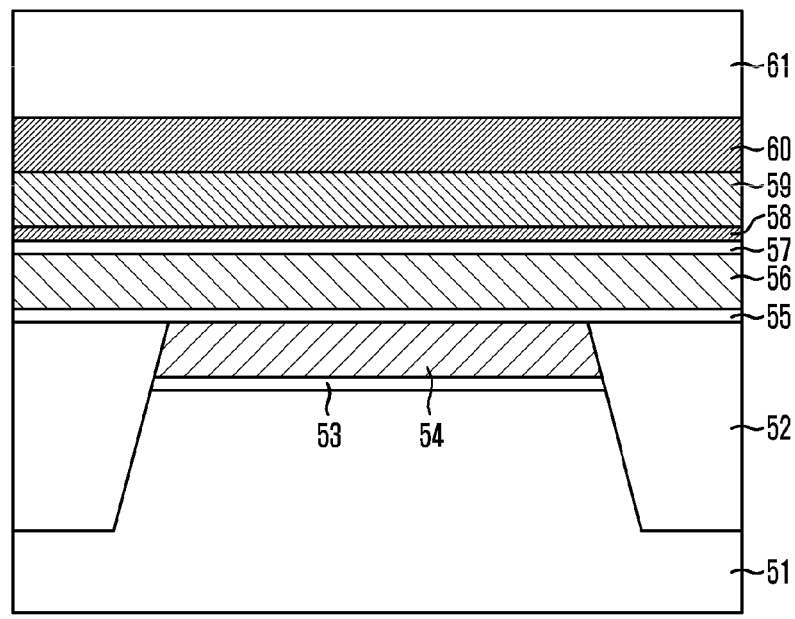

Referring to FIG. 6E, a first metal layer 58, a polysilicon layer 59 and a second metal layer 60 are sequentially formed over the third blocking layer 57. The first metal layer 58 is formed by using a material to control leakage current of the second blocking layer 56 and the third blocking layer 57 and the material has a high work function. The first metal layer 58 with the high work function greater than a mid gap may include one selected from a group consisting of Pt, Ru, TiN, WN, TaN, Ir, Mo, Co, Ni, NiSi, NiPtSi, NiCSi, CoSi, and a combination thereof. The first metal layer 58 has a thickness ranging from approximately 50 Å to approximately 200 Å.

The polysilicon layer 59 is used as a control gate and the second metal layer 60 may include a low resistance metal layer, such as tungsten (W), for decreasing resistance of the control gate. Although it is not shown, a barrier metal layer may be formed between the polysilicon layer 59 and the second metal layer 60 in order to prevent interactive diffusion between the polysilicon layer 59 and the second metal layer 60.

A hard mask insulation layer 61 is formed over the second metal layer 60. The hard mask insulation layer 61 is used as an etch barrier during a subsequent etching process. The hard mask insulation layer 61 may include a nitride layer.

Figure 6F:
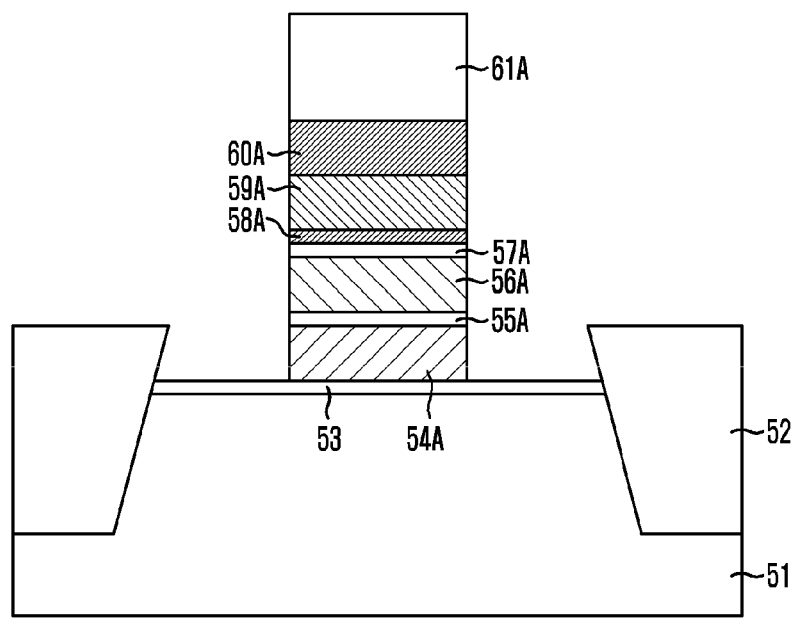

Referring to FIG. 6F, the hard mask insulation layer 61, the second metal layer 60, the polysilicon layer 59, the first metal layer 58, the third blocking layer 57, the second blocking layer 56, the first blocking layer 55 and the charge storage layer 54 are sequentially etched. Thus, a hard mask insulation pattern 61A, a second metal pattern 60A, a polysilicon pattern 59A, a first metal pattern 58A, a third blocking pattern 57A, a second blocking pattern 56A, a first blocking pattern 55A and a charge storage pattern 54A are formed.

In the described structure, when the charge storage pattern 54A in a device includes a silicon nitride layer, the device becomes a charge trap type nonvolatile memory device, and when the charge storage pattern 54A in a device includes a polysilicon layer, the device becomes a floating type nonvolatile memory device.

Figure 7A:
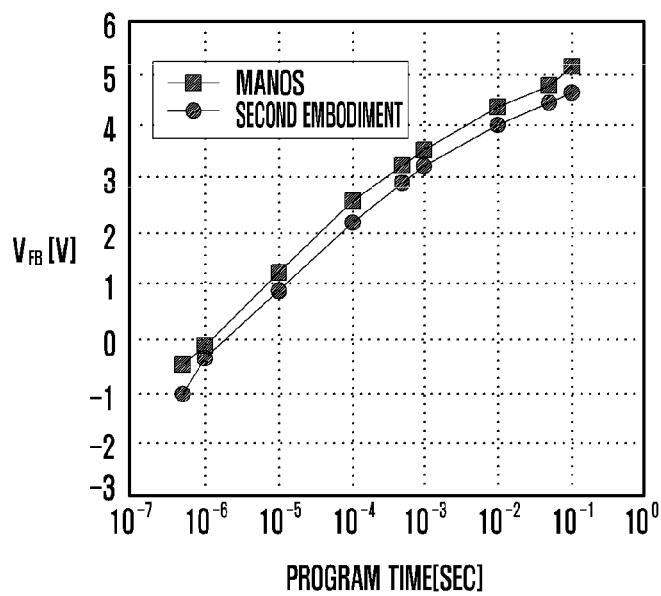
FIG. 7A is a comparative graph showing flat band voltages ($V_{FB}$) of the nonvolatile memory device according to the another embodiment and a typical MANOS structure with respect to programming times.

FIG. 7A is a comparative graph showing the flat band voltages ($V_{FB}$) of the nonvolatile memory device according to the another embodiment and the typical MANOS structure with respect to programming times. The X-axis represents the programming time and the Y-axis represents the flat band voltage $V_{FB}$. A silicon oxide layer is used as the tunneling layer, a silicon nitride layer is used as the charge storage layer and a stack structure of $SiO_2$, HfAlO and $Al_2O_3$ is used as the blocking layer in accordance with the another embodiment as shown in FIG. 7A. A silicon oxide layer is used as the tunneling layer, a silicon nitride layer is used as the charge storage layer and an $Al_2O_3$ layer is used as the blocking layer in accordance with the typical MANOS structure.

Referring to FIG. 7A, with respect to a same programming time, the flat band voltage $V_{FB}$ of the another embodiment shows a different value from that of the typical MANOS structure due to the difference in the type of the blocking layers. However, the slope of the flat band voltages $V_{FB}$ of the another embodiment is similar to that of the typical MANOS structure. Thus, it can be seen that the programming time of the another embodiment is similar to that of the typical MANOS structure.

Figure 7B:
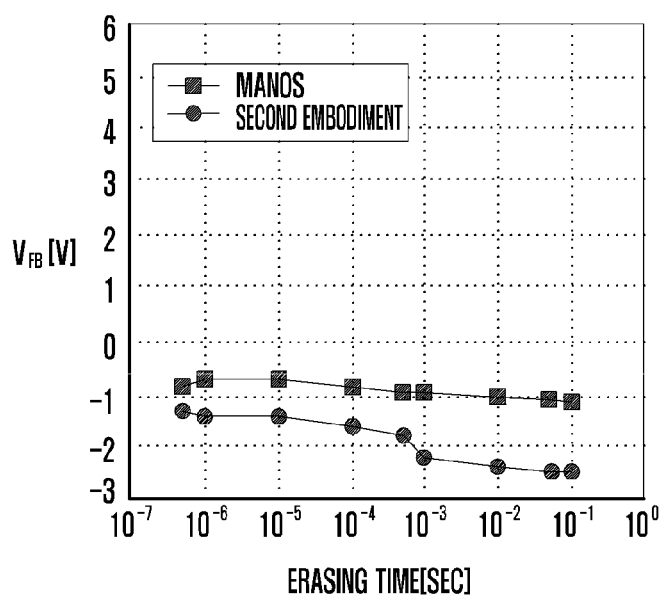
FIG. 7B is a comparative graph showing flat band voltages ($V_{FB}$) of the nonvolatile memory device according to the another embodiment and the typical MANOS structure with respect to erasing times.

FIG. 7B is a comparative graph showing the flat band voltages ($V_{FB}$) of the nonvolatile memory device according to the another embodiment and the typical MANOS structure with respect to erasing times. The X-axis represents the erasing time and the Y-axis represents the flat band voltage $V_{FB}$. A silicon oxide layer is used as the tunneling layer, a silicon nitride layer is used as the charge storage layer and a stack structure of $SiO_2$, HfAlO and $Al_2O_3$ is used as the blocking layer in accordance with the another embodiment as shown in FIG. 7B. A silicon oxide layer is used as the tunneling layer, a silicon nitride layer is used as the charge storage layer and an $Al_2O_3$ layer is used as the blocking layer in accordance with the typical MANOS structure.

It can be seen from FIG. 7B that the $V_{FB}$ of the another embodiment using the stack structure of $SiO_2$, HfAlO and $Al_2O_3$ as the blocking layer is smaller than the $V_{FB}$ of the typical MANOS structure using only the $Al_2O_3$ layer as the blocking layer, with respect to a same erasing time. Based on the above result, it can be seen that when the stack structure of $SiO_2$, HfAlO and $Al_2O_3$ is used as the blocking layer, the erasing voltage can be further decreased for the same erasing time. Furthermore, it also means that when the same erasing voltage is applied, the erasing time can be further decreased.

Figure 8:
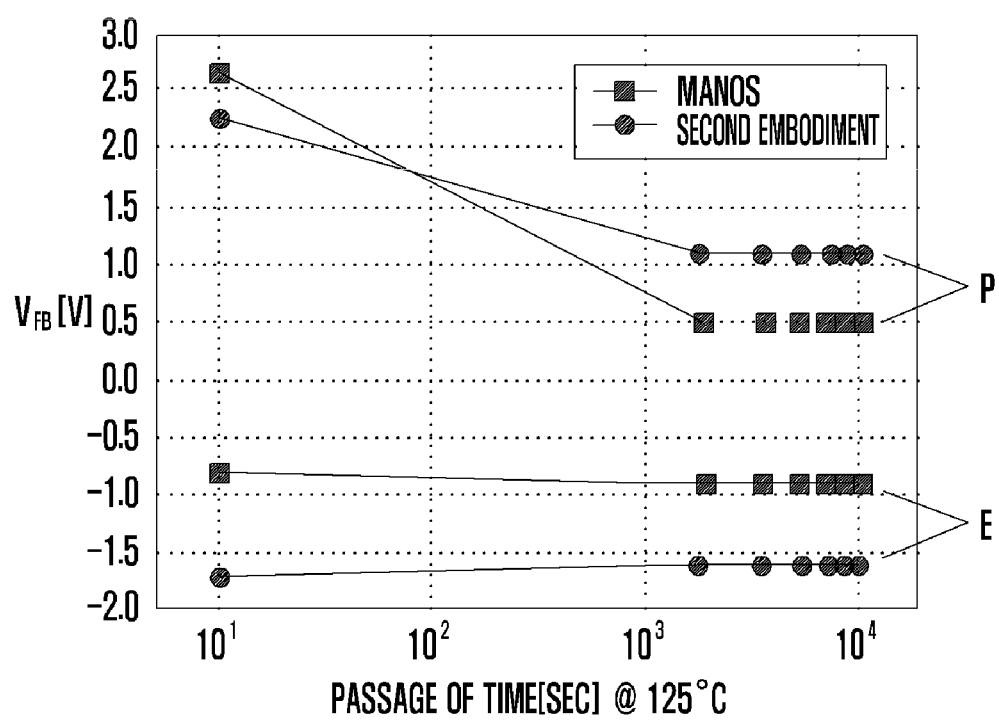
FIG. 8 is a comparative graph showing data retention characteristics of the nonvolatile memory device according to the another embodiment and the typical MANOS structure.

FIG. 8 is a comparative graph showing the data retention characteristics of the nonvolatile memory device according to the another embodiment and the typical MANOS structure.

Referring to FIG. 8, with regard to programming statement P, the flat band voltage change ($\Delta V_{FB}$) for approximately 1,000 sec is approximately 1.25 V and, with regard to erasing statement E, the flat band voltage change ($\Delta V_{FB}$) for approximately 1,000 sec is less than approximately 0.1 V in accordance with the another embodiment.

Referring further to FIG. 8, with regard to programming statement P, the flat band voltage change $\Delta V_{FB}$ for approximately 1,000 sec is approximately 2.25 V and, with regard to erasing statement E, the flat band voltage change $\Delta V_{FB}$ for approximately 1,000 sec is less than approximately 0.1 V.

As such, it can be seen from FIG. 8 that the change of the $V_{FB}$ of the device in accordance with the another embodiment is smaller than that in accordance with the typical MANOS structure with regard to programming statement P with the passage of time. Furthermore, the flat band voltage in accordance with the another embodiment is much smaller than that in accordance with the typical MANOS structure with the same passage of time.

Referring to FIG. 8, it can be confirmed that the nonvolatile memory device in accordance with embodiments disclosed in the present application has superior data retention characteristics.

According to the results in the above-described FIGS. 7A to 8, embodiments disclosed in the present application can improve programming and erasing characteristics because the blocking layer is formed as multiple layers such as stacked layers of $SiO_2$, HfAlO and $Al_2O_3$, instead of using a monolayer such as an $Al_2O_3$ layer or a high-k dielectric layer. Furthermore, embodiments can have superior data retention characteristics to those of the typical MANOS structure and a typical floating gate type.

Further, although the results as shown in FIGS. 7A to 8 are obtained by using the blocking layer as the stack structure of $SiO_2$, HfAlO and $Al_2O_3$, excellent programming and erasing characteristics and data retention characteristics similar to those shown in FIGS. 7A to 8 can be also obtained by using a stack structure of $SiO_2$ and HfAlO as the blocking layer.

As described above, in accordance with one or more embodiments, since the blocking layer is formed by using one selected from a group consisting of a stack structure of a high-k dielectric layer and an oxide layer, a stack structure of a high-k dielectric layer and an oxynitride layer, a stack structure of an aluminum oxide layer, a high-k dielectric layer and an oxide layer and a stack structure of aluminum oxide layer, a high-k dielectric layer and an oxynitride layer, users can obtain improved programming and erasing characteristics and data retention characteristics.

Reference numerals 101, 102, 103A, 103B, 104A, 104B and 104C in the device in FIG. 3A respectively correspond to reference numerals 43, 44, 45, 46, 47, 48 and 49 in the device in FIG. 5E. Furthermore, reference numerals 201, 202, 203A, 203B, 203C, 204A, 204B and 204C in the device in FIG. 4A are respectively corresponding to reference numerals 53, 54A, 55A, 56A, 57A, 58A, 59A, 60A in the device shown in FIG. 6F. Also, the devices shown in FIGS. 3A and 4A are merely illustrated with distinctive features for the purpose of simplification. Although FIGS. 5A to 5E and FIGS. 6A to 6F illustrate with all of the progress of the processes, the patterning of the numerals 43 and 53 is omitted.

While embodiments have been described, the above embodiments are illustrative and not limitative. It will be apparent to those skilled in the art that various changes and modifications may be made without departing from the spirit and scope of what is defined in the following claims.

What is claimed is:

1. A method for fabricating a nonvolatile memory device, the method comprising:
   forming a tunneling layer over a first conductive layer;
   forming a charge storage layer over the tunneling layer;
   forming a blocking layer including a first blocking layer in contact with the charge storage layer, a second blocking layer over the first blocking layer and a third blocking layer over the second blocking layer; and
   forming a second conductive layer in contact with the third blocking layer,
   wherein an energy gap of the first blocking layer is greater than that of the second blocking layer,
   wherein the third blocking layer has a lower permittivity and a greater energy band gap than those of the second blocking layer, and wherein the third blocking layer comprises a metal oxide layer.

2. The method of claim 1, wherein the third blocking layer comprises an aluminum oxide ($Al_2O_3$) layer.

3. The method of claim 1, wherein the third blocking layer has the energy band gap as high as that of the first blocking layer or greater than that of the first blocking layer.

4. The method of claim 3, wherein the stack structure comprises a polysilicon layer and a second metal layer formed over the first metal layer.

5. The method of claim 1, wherein the first block layer has a lower density of trap sites than the second blocking layer.

6. The method for claim 1, wherein the first blocking layer includes an oxide layer or an oxynitride layer.

7. The method of claim 1, wherein the first blocking layer includes a silicon oxide ($SiO_2$) layer or a silicon oxynitride layer (SiON).

8. The method of claim 1, wherein the second blocking layer includes one selected from the group consisting of HfAlO, ZrAlO, LaAlO, DyScO, GdAlO, YAlO, NdAlO, CeAlO and PrAlO.

9. The method of claim 1, wherein the charge storage layer includes a silicon nitride layer or a polysilicon layer.

10. The method of claim 1, wherein the first blocking layer is formed by oxidizing a portion of the charge storage layer.

11. The method of claim 10, wherein the oxidizing of the portion of the charge storage layer is performed by using a radical oxidation method.

12. The method of claim 1, wherein the first blocking layer is formed by oxidizing a portion of the charge storage layer and nitriding the oxidized portion.

13. The method of claim 12, wherein the nitridation is performed by using a thermal nitridation process or a plasma nitridation process.

14. The method of claim 1, wherein the second conductive layer comprises a stack structure including a first metal layer having a work function greater than a mid gap of silicon.

15. The method of claim 14, wherein the first metal layer comprises one selected from the group consisting of Pt, Ru, TiN, WN, TaN, Ir, Mo, Co, Ni, NiSi, NiPtSi, NiCSi, CoSi, and a combination thereof.

* * * * *